Figure 1:
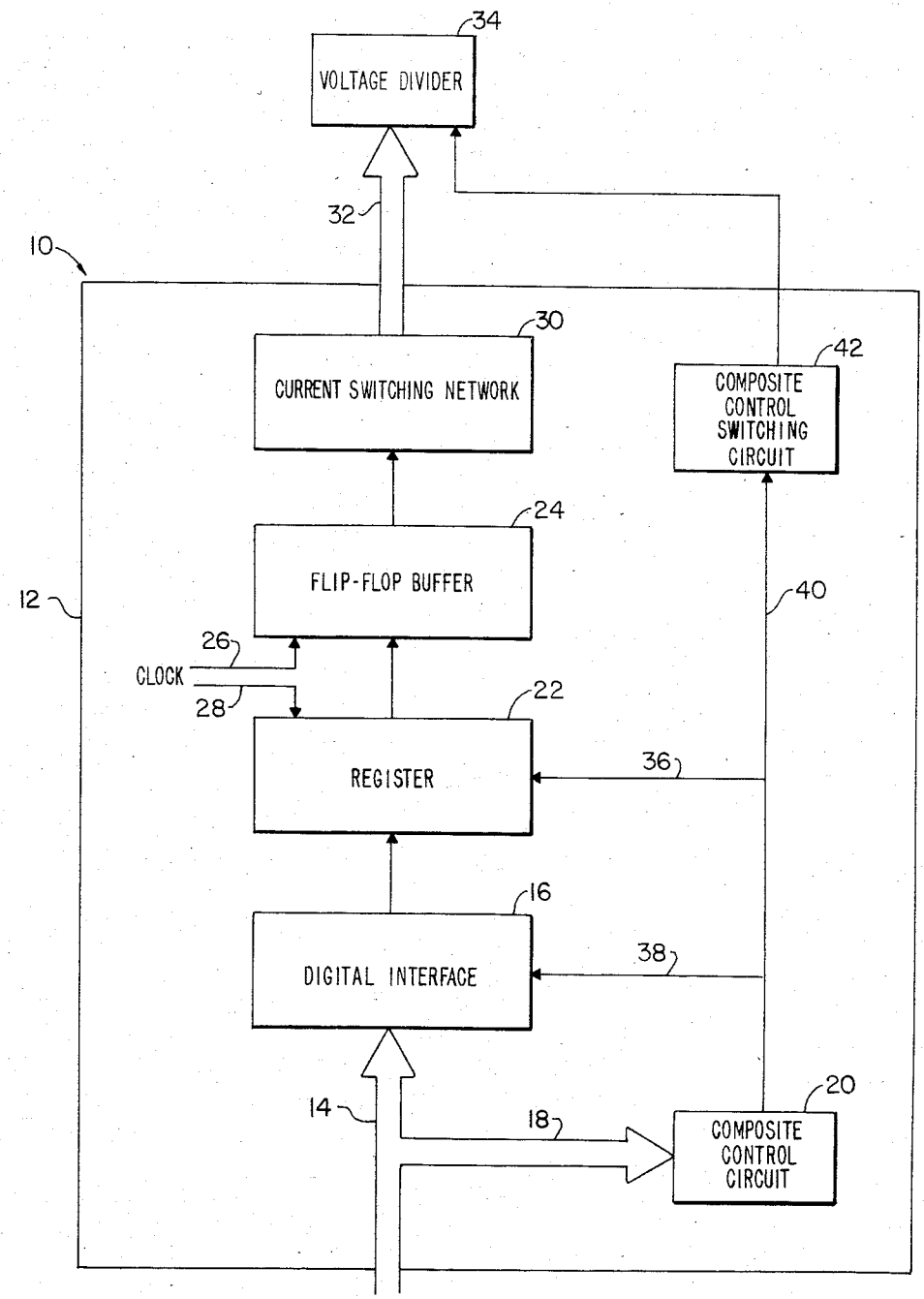

United States Patent [19]

Botka et al.

[11] Patent Number: 4,607,248

[45] Date of Patent: Aug. 19, 1986

[54] DIGITAL TO ANALOG CONVERTER HAVING INTEGRATED DIGITAL AND ANALOG CIRCUITRY

[75] Inventors: Alexander T. Botka, Underhill, Vt.; Evan Colton, Lynnfield, Mass.

[73] Assignee: Analogic Corporation, Wakefield, Mass.

[21] Appl. No.: 516,765

[22] Filed: Jul. 25, 1983

[51] Int. Cl.$^4$ ............................................ H03K 13/02
[52] U.S. Cl. ...................... 340/347 DA; 340/347 CC; 340/347 M; 307/591; 328/55
[58] Field of Search ................. 340/347 DA, 347 CC, 340/347 M; 307/591; 328/55

[56] References Cited

U.S. PATENT DOCUMENTS 3,961,326  6/1976  Craven ........................ 340/347 DA
4,045,793  8/1977  Moench ...................... 340/347 DA

OTHER PUBLICATIONS

Schmid, Electronic Analog/Digital Conversions, Van Nostrand Reinhold Company, 1970, pp. 170–179.

Primary Examiner—T. J. Sloyan
Attorney, Agent, or Firm—Joseph S. Iandiorio; William E. Noonan

[57] ABSTRACT

A D/A converter for converting a digital signal having a number of bits to an analog signal. The converter is fabricated in an integrated circuit digital array including a register for storing the particular number of bits, a buffer circuit for receiving those bits from the register, and an analog current switching network. The analog current switching network includes a number of current switching circuits, each of which provides the proper current output in response to the delivery of an associated bit from the buffer circuit. Each current switching circuit includes an emitter coupled switch circuit having two pluralities of parallel connected transistor cells with the bases of one of the plurality of transistor cells connected with the buffer circuit and the bases of the other of the plurality of transistor cells connected with the current switching circuit. The current switching circuit includes a first transistor cell with its emitter connected to the base of the other of the plurality of transistor cells in the emitter coupled switch circuit. A voltage summing network responsive to the current output from the analog current switching network provides voltages representative of the bit presented by the associated buffer circuit.

9 Claims, 6 Drawing Figures

4,607,248

DIGITAL TO ANALOG CONVERTER HAVING INTEGRATED DIGITAL AND ANALOG CIRCUITRY

FIELD OF INVENTION

This invention relates to a digital to analog converter array, and more particularly to such a converter array in which both the analog and digital circuit portions are implemented on the same custom digital array.

BACKGROUND OF INVENTION

Conventional D/A converters such as used to convert digital information signals to analog video signals utilize a register for receiving the multi-bit, e.g. eight-bit, digital input. From the register the bits are strobed into associated buffers, which drive corresponding constant current switching circuits whose outputs are attenuated in accordance with the bit positions by an R-2R resistor network. An R-2R resistor network is a combination of series and parallel resistors connected as a voltage divider which causes each successive bit to appear at half the voltage of the previous bit with equal current gated at each bit. These converters use discrete switching components for the analog signals in combination with integrated circuits for the registers and buffers for the digital signals. In such converters the analog switching circuits require labor intensive component tuning and matching, which increases their cost. The use of such a converter with integrated or discrete components requires considerably more power, e.g. 1.6 watts for TTL and 2.8 watts for ECL. In addition, the highest toggle frequency obtainable with acceptable "glitch" (switching waveform distortion) is limited by the available discrete component parameters and the interconnecting circuit parasitic contributions.

SUMMARY OF INVENTION

It is therefore an object of this invention to provide an improved smaller, less expensive and simpler D/A converter.

It is a further object of this invention to provide such an improved D/A converter which requires little or no tuning or matching of components.

It is a further object of this invention to provide such an improved D/A converter which requires less power in both TTL and ECL versions.

It is a further object of this invention to provide such an improved D/A converter which requires only 1.1 watts maximum in the TTL version and 1.0 watts in the ECL version.

It is a further object of this invention to provide such an improved D/A converter which can operate at higher toggle frequencies without unacceptable "glitch".

It is a further object of this invention to provide such an improved D/A converter which can operate at a toggle frequency of 180 mHz without unacceptable "glitch".

It is a further object of this invention to provide such an improved D/A converter which has less interconnecting circuit parasitic contributions.

It is a further object of this invention to provide such an improved D/A converter which is made wholly in integrated circuit form.

It is a further object of this invention to provide such an improved D/A converter which has both its digital and analog components implemented in a digital array chip.

The invention results from the realization that a preselected subset of the elemental cells of a digital gate array may be connected to form analog current switching circuits so that the active parts of a complete digital to analog converter may be fabricated on a single, originally wholly digital, gate array chip.

The invention features a D/A converter for converting to an analog signal a digital signal having a number of bits. The invention includes an integrated circuit digital array having a register for storing the particular number of bits, a buffer circuit for receiving the number of bits from the register, and an analog current switching network. The analog current switching network includes a number of current switching circuits commensurate in number with the number of bits being converted. Each of the current switching circuits provides the proper current output in response to the delivery of an associated bit from the buffer circuit. Each of the current switching circuits includes an emitter coupled switch circuit having two pluralities of parallel connected transistor cells. The bases of one of the plurality of transistor cells are connected with the buffer circuit and the bases of the other of the plurality of transistor cells are connected with the current switching circuit. The current switching circuit includes a first transistor cell with its emitter connected to the base of the other plurality of transistor cells in the emitter coupled switch circuit. A voltage divider network is responsive to the current output from the analog current switching network for providing voltages representative of the bit represented by the associated buffer circuit.

In a preferred embodiment, the current source circuit may include a second transistor cell with its collector connected to the emitter of the first transistor cell, its base adapted for connection with a reference voltage source and its emitter connected with a bias resistor network connected with a supply voltage source. The bias resistor network may include a plurality of resistor cells connected in parallel. Each of the plurality of transistor cells may include three transistor cells. The collectors of the other plurality of transistor cells and the collector of the first transistor cell may be connected together.

DISCLOSURE OF PREFERRED EMBODIMENT

Figure 2A:
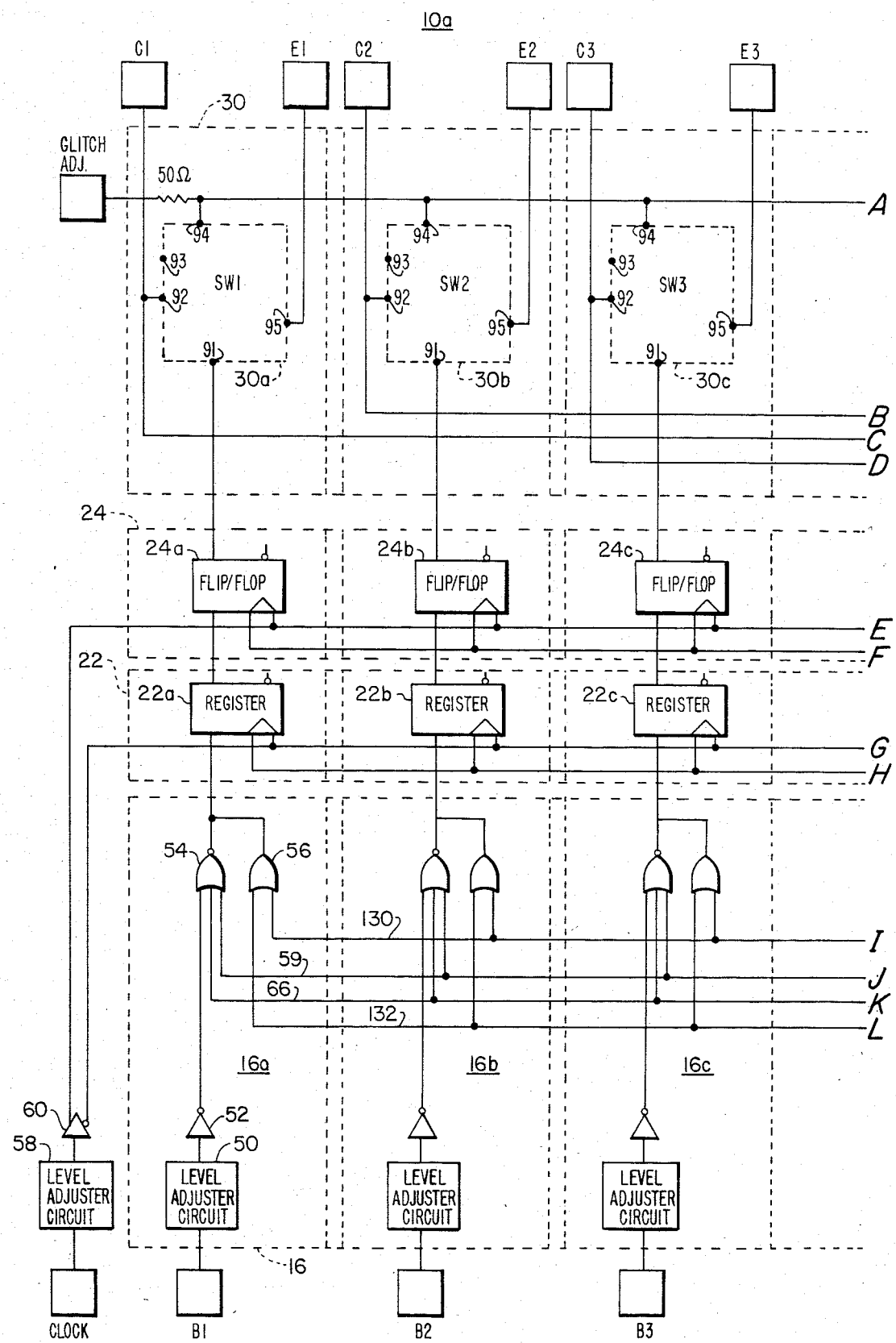
Figure 2B:
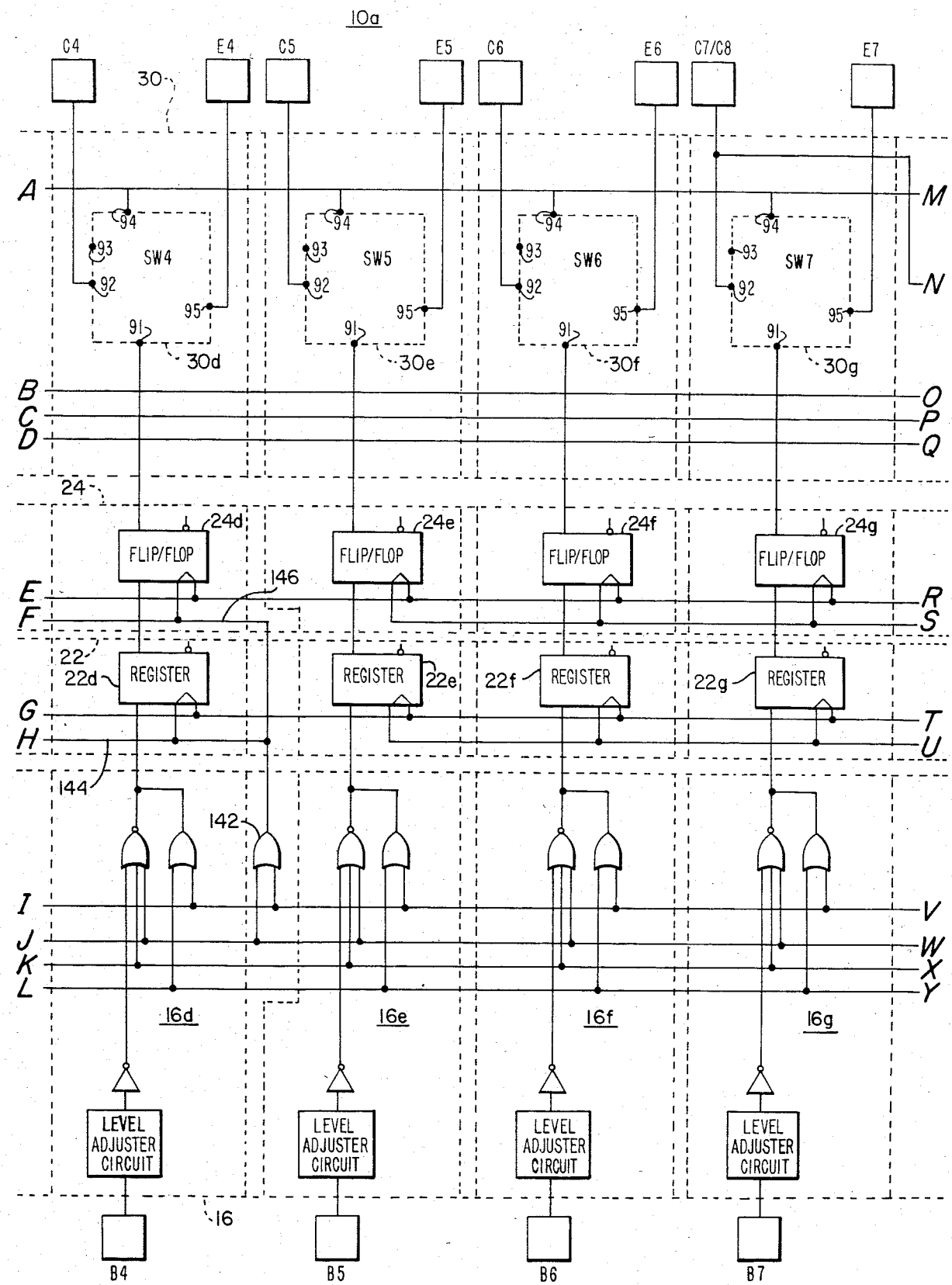
Figure 2C:
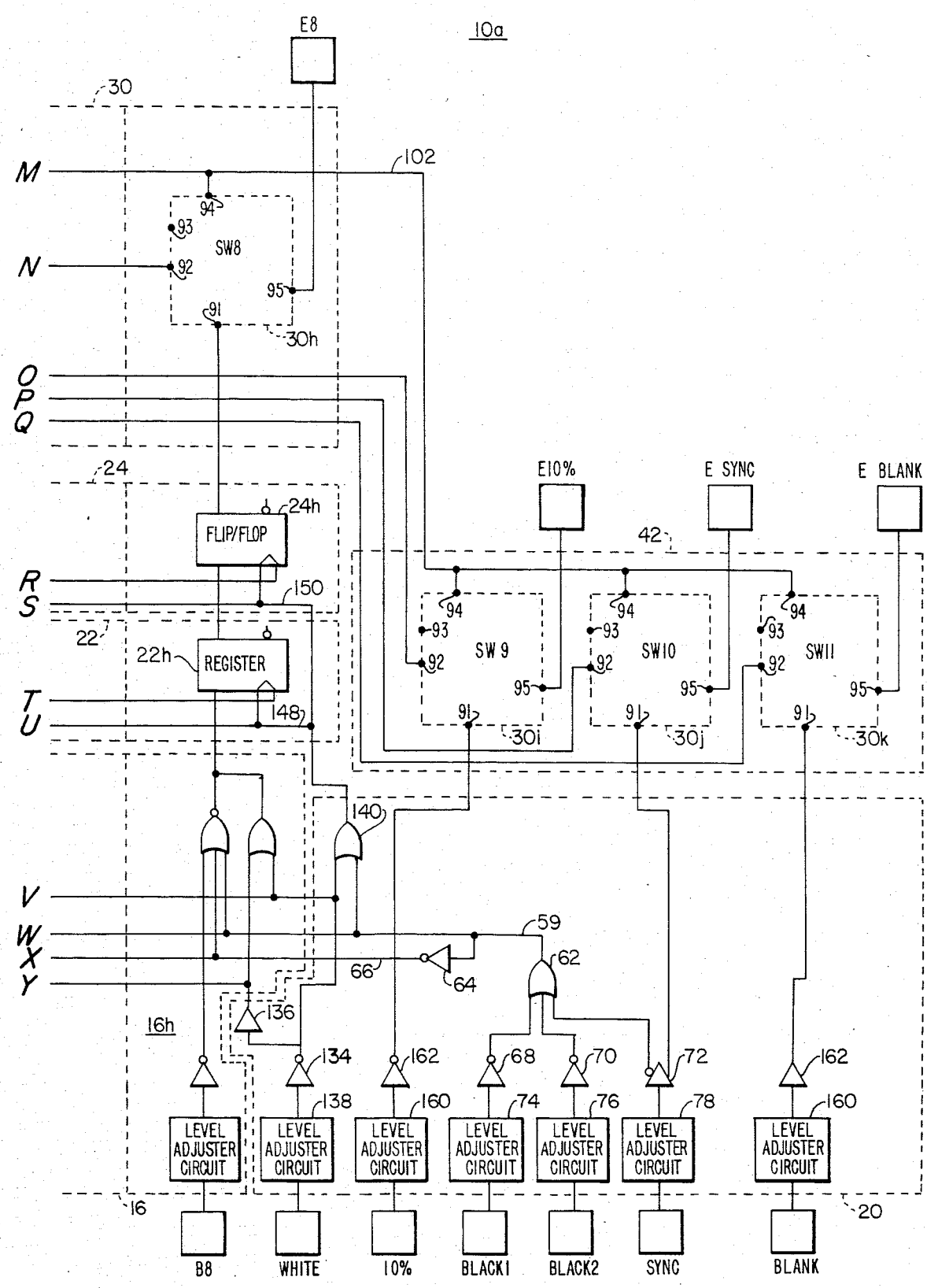
Figure 3:
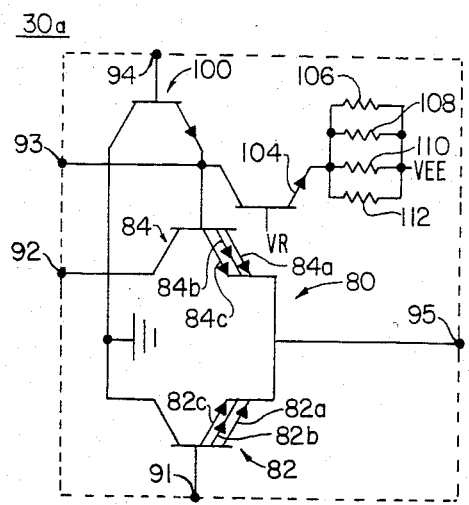
Figure 4:
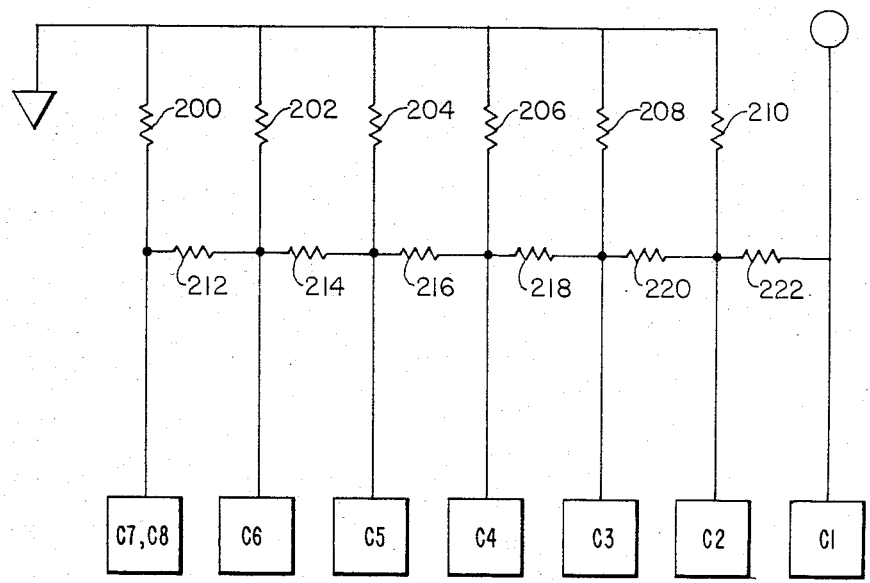

Other objects, features and advantages will occur from the following description of a preferred embodiment and the accompanying drawings, in which:

FIG. 1 is a simplified block diagram of a D/A converter according to this invention;

FIGS. 2A–C are more detailed schematic diagrams of one implementation of the converter of FIG. 1;

FIG. 3 is a more detailed drawing of an analog current switching circuit formed from the digital gate array of FIG. 2; and FIG. 4 is a more detailed schematic of the voltage divider of FIG. 1.

There is shown in FIG. 1 a digital to analog converter array 10 mounted on a single substrate 12. Digital input information provided in the form of a multibit address or word is provided on line 14 to digital interface 16. Composite signals which often accompany video digital information signals, are provided on line 18 to composite control circuit 20. Digital interface 16 adjusts the level of the incoming bits and interjects the control signals, such as Reference White; 10%; Black 1; Black 2; Sync; and Blank; into the incoming bits. The bits are stored in register 22 until they are clocked into flip-flop buffer 24 by strobe signals 26 and 28. Upon transfer to buffer 24, the bit signals are immediately delivered to current switching network 30, which provides the same current output for each bit which is presented from buffer 24. Those current outputs are delivered on line 32 to an R2R type voltage divider 34, which develops a voltage dependent upon the bit position or address. The composite control circuit 20 provides set and reset signals on lines 36 and 38 to register 22 and digital interface 16, respectively. Composite control circuit 20 also provides a signal on line 40 to composite control switching circuit 42 which directly affects the analog output of voltage divider 34.

In one implementation, an eight-bit digital to analog converter 10a according to this invention 10a may be constructed using a Q 720 gate array of Applied Micro Circuits Corporation, Cupertino, Calif., as shown in FIG. 2, wherein like parts have been given like numbers with respect to FIG. 1 and each of the eight stages of the parts have been given the same number accompanied by a lower case a–h.

In FIGS. 2A–C, the small square boxes on substrate 12 are contacts which are provided for the signals with which they are labelled.

Contacts B1–B8 are those that receive the eight-bit digital input signal. The composite input signals or contacts are labelled "White", "10%", "Black 1", "Black 2", "Sync" and "Blank". The composite output signals, "E Blank", "E Sync", and "E 10%", are interconnected with voltage divider 34, FIG. 1, as are signals C1–C8. Contacts E1–E8 interconnect with a resistor biasing network for circuits 30a–h. The glitch adjust contact receives the glitch adjust input from an external source and the clock contact receives the clock signals from an external clock.

Digital interface 16 includes eight stages: 16a–16h. Each stage, as exemplified by stage 16a, includes a level shift circuit 50, which accepts TTL or ECL logic signals and converts them to the lower level acceptable to the internal circuits of the digital to analog converter array. The level adjust circuits 50 may be implemented by the input/output cells. The output of level adjuster circuit 50 is delivered to a buffer amplifier 52. Also included in digital interface 16 when the system is accompanied by a composite control circuit, are NOR gate 54 and OR gate 56. The outputs of these gates in stages 16a–h are fed to the corresponding register stage 22a–h. NOR gate 54 provides an output to transfer an incoming bit upon the presence of the bit at the output of buffer amplifier 52. The other inputs to NOR gate 54 and the operation of OR gate 56 are controlled by composite control circuit 20 and will be explained subsequently. When a bit is transferred from NOR gate 54, it is stored in stage 22a of register 22. Upon the appearance of a strobe signal, at the strobe contact, the strobe signal will be processed by level adjuster circuit 58 and through amplifier 60 provides a strobing signal to each of the stages 22a–h of register 22 and each of the stages 24a–h of buffer 24, to transfer the respective bits from their register stages to the corresponding buffer stages. Immediately upon receipt in buffer stages 24a–h, the bit is transferred to the individual current switching circuits 30a–h, whereupon it is directly presented through contacts C1–8 to the voltage divider 34, FIG. 1.

Each of current switching circuits 30a–h, as exemplified by circuit 30e, FIG. 3, includes an emitter coupled switching pair 80 such as an ECL circuit, wherein each transistor pair 82, 84, is actually formed of a plurality of transistor cells 82a, 82b, 82c, and 84a, 84b, 84c, as indicated by the triple emitter depictions. This is necessary to make up the desired current level, 8.5 milliamps, which is unavailable with any single transistor cell in the conventional digital array. Circuit 30a has five contacts 91, 92, 93, 94 and 95. Output 91 interconnects the base of transistor 82 with buffer stage 24a. Output 92 interconnects the collector of transistor 84 with its respective collector output contact C1–C8, FIG. 2. The base of transistor 84 interconnects with the emitter of transistor 100. The base of transistor 84 and emitter of transistor 100 are connected to output 93, a test point. The base of transistor 100 is connected to output 94, which connects directly to a glitch adjust line 102, through which an external glitch adjustment signal is introduced via the glitch adjustment contact. The emitters of transistors 84 and 82 are both connected to output 95, which connects to the respective one of the E1–E8 outputs, FIG. 2. There is also provided, in conjunction with the current source transistor 100, a voltage reference transistor 104, whose emitter is connected with voltage reference resistors 106, 108, 110 and 112. The novel connection of the uncommitted gates in the conventional gate array to form the current switching circuit 30e FIG. 3, enables a conventional digital gate array substrate to be used to form analog circuits on a digital array so that the analog as well as the digital circuitry of a digital to analog converter can be fabricated on a single digital array chip. This construction enables a smaller, less expensive and simpler D/A converter to be manufactured, which requires little or no tuning or matching of components and which uses less power in both TTL and ECL versions. It also operates at higher toggle frequencies within acceptable "glitch" limits and minimizes interconnecting circuit parasitic contributions.

The input on pin 91 may assume two values, for example a logic "1" and a logic "0". A suitable bias voltage is applied at pin 94. This voltage will be approximately halfway between the logic "1" voltage and the logic "0" voltage. When a logic "1" is applied to pin 91 the current at pin 92 is zero. When a logic "0" is applied to pin 91 the current at pin 92 is a predetermined value set by a current source connected to pin 95. Because of the finite rise and fall times of the signal at pin 91 the switching of the current will be delayed when referenced to the strobe (clock) input. If the bias on pin 91 is made more positive, the delay in the current turning on at pin 92 is 92 is shortened and if the bias is made more negative the delay in turning on is lengthened. If in a n bit digital to analog converter the most significant bit is turned on and the n−1 remaining bits are turned off (by the data input and strobe pulse), then depending on the bias voltage the MSB will turn on sooner, equal to, or later than the n−1 lower bits. If sooner, then the current at pin 92 and consequently the output voltage (through network in FIG. 4) will increase and then decrease to this final value. If later then the reverse will happen. This transient is commonly called a "glitch". By adjusting the bias at pin 94 the "glitch" may be minimized. The buffer transistor 100 minimizes interaction between the n bits. Since the currents being switched in each current switch are equal the time difference due to parasitics (i.e. capacitance) are kept to a minimum, thereby keeping the "glitch" to a minimum. The ladder, FIG. 4, weights the current in a desired manner creating the desired output voltage.

Composite control circuit 20, FIG. 2C, operates through NOR gate 54 and OR gate 56 to provide signals which may override the incoming eight-bit word or address. NOR gate 54, in addition to receiving the bit signal from the output of buffer amplifier 52, also receives on line 59 the output of OR gate 62, which after inversion by buffer amplifier 64 is also provided on line 66 as the third input to NOR gate 54. OR gate 62 in turn receives inputs from buffer amplifiers 68, 70 and 72, which are driven by the "Black 1", "Black 2" and "Sync" signals through level adjusters 74, 76 and 78, respectively. Thus, upon the receipt of a "Black 1", "Black 2" or "Sync" signal, OR gate 62 will provide over lines 59 and 66 a signal to NOR gate 54 which will cause switching circuits 30a–h to provide a proper analog level for the "Black" and "Sync" signals. OR gate 56 receives on lines 130 and 132, signals from buffer amplifiers 134 and 136, respectively, derived from level adjuster circuit 138 upon receipt of a "White" command. Thus, upon the appearance of a "White" signal, an analog signal producing a total "White" output is provided by current switching circuits 30a–h.

The "White" command output from buffer amplifier 134 also provides one input to set and reset OR gates 140 and 142. OR gate 142 provides "Set" and "Reset" signals on lines 144 and 146, FIG. 2B, to register stages 22a–d and buffer stages 24a–d, respectively. OR gate 140 provides similar signals on lines 148 and 150 to register stages 22e–h and buffer stages 24e–h, respectively.

The "Sync" signal, in addition to working through OR gate 62 and NOR gates 54, works directly through the composite control switching circuit 42, as do the composite signals denominated 10%, White, and Black. Composite control switching circuit 42 includes three current switching circuits 30i, 30j and 30k, which are identical with circuits 30a–h. A 10% command after processing by level adjuster 160 and buffer amplifier 162 is fed directly to input 91 of circuit 30i which is the base of transistor 82 shown on FIG. 3. This generates an output at 92 which establishes a zero analog output voltage. A Sync signal present at the output of buffer amplifier 72, in addition to being fed to OR gate 62 is also delivered to input 91 of current switching circuit 30j which generates an output at contact 92 of the required level for a standard Sync signal. A Blank command, after being processed by level adjuster 160 and buffer amplifier 162, is delivered to input 91 of switching circuit 30h which generates an output at contact 92 and provides for the blanking of the analog output signal.

The proper bias for operating the switching circuits 30a–k is provided through emitter connections E1–E8 to set the proper switching levels. The contacts C1–C8 are interconnected with the R2R voltage divider 34, FIG. 4. To conserve contacts, connector C7 and C8 have been connected to the same contact. Each of the resistors 200, 202, 204, 206, 208 and 210 are 75 ohms, while resistors 212, 214, 216, 218, 220 and 222 are 37½ ohms, or any other value required by the output match, or roughly half of the 75 ohms value. With this network, the output of each current switching circuit 30a through 30h is equal and yet produces a different voltage dependent upon the bit position of the particular bit served; and the entire network provides an analog output which is matched to a 75 ohm impedance line.

Other embodiments will occur to those skilled in the art and are within the following claims:

What is claimed is:

1. A D/A converter for converting a digital signal having a number of bits to an analog signal comprising:
an integrated circuit digital array disposed on a single monolithic element and including:
a register for storing said number of bits;
a buffer circuit for receiving said number of bits from said register;
an analog current switching network including a said number of first current switching circuits, each of which provides the proper current output in response to the delivery of an associated bit from said buffer circuit; each said first current switching circuit including an emitter coupled switch circuit including two pluralities of parallel connected transistor cells, with the base of each one of the cells of one of the pluralities of transistor cells connected with said buffer circuit and the base of each one of the cells of the other of the pluralities of transistor cells connected with a second current switching circuit, said second current switching circuit including a first transistor cell with its emitter connected to the base of each one of the cells of said other of the pluralities of transistor cells in said emitter coupled switch circuit whereby the switched currents are nominally equal and the glitch is minimized by virtually equalizing the turn-on and turn-off times of said first current switching circuits; and
a voltage divider network responsive to the current output from said analog current switching network for providing voltages representative of the bit presented by the associated buffer circuit.

2. The converter of claim 1 in which said current switching circuit includes a second transistor cell with its collector connected to the emitter of said first transistor cell, its base adapted for connection with a reference voltage source and its emitter connected with a bias resistor network connected with a voltage source.

3. The converter of claim 2 in which said bias resistor network includes a plurality of resistor cells connected in parallel.

4. The converter of claim 1 in which each of said plurality of transistor cells includes three transistor cells.

5. The converter of claim 1 in which the collectors of said other plurality of transistor cells and of said first transistor cell are connected together.

6. A D/A converter for converting a digital signal having a number of bits to an analog signal comprising:
an integrated circuit digital array including:
a register for storing said number of bits;
a buffer circuit for receiving said number of bits from said register;
an analog current switching network including a said number of first current switching circuits, each of which provides the proper current output in response to the delivery of an associated bit from said buffer circuit; each said first current switching circuit including an emitter coupled switch circuit including two pluralities of parallel connected transistor cells, with the base of each one of the cells of one of the pluralities of transistor cells connected with said buffer circuit and the base of each one of the cells of the other of the pluralities of transistor cells connected with a second current switching circuit, said second current switching circuit including a first transistor cell with its emitter connected to the base of each one of the cells of said other of the pluralities of transistor cells in said emitter coupled switch circuit and a second transistor with its collector connected to the emitter of said first transistor cell, its base adapted for connection with a reference voltage source and its emitter connected with a bias resistor network connected with a voltage source; and a voltage divider network responsive to the current output from said analog current switching network for providing voltages representative of the bit presented by the associated buffer circuit.

7. The converter of claim 6 in which said bias resistor network includes a plurality of resistor cells connected in parallel.

8. The converter of claim 6 in which each of said plurality of transistor cells includes three transistor cells.

9. The converter of claim 6 in which the collectors of said other plurality of transistor cells and of said first transistor cell are connected together.

* * * * *